(12) United States Patent
Lutkemeyer

(10) Patent No.: US 7,411,523 B2
(45) Date of Patent: *Aug. 12, 2008

(54) HARDWARE EFFICIENT IMPLEMENTATION OF FINITE IMPULSE RESPONSE FILTERS WITH LIMITED RANGE INPUT SIGNALS

(75) Inventor: Christian Lutkemeyer, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/748,923

(22) Filed: May 15, 2007

(65) Prior Publication Data

US 2007/0210942 A1 Sep. 13, 2007

Related U.S. Application Data

(63) Continuation of application No. 11/058,388, filed on Feb. 15, 2005, now Pat. No. 7,218,253, which is a continuation of application No. 10/774,151, filed on Feb. 5, 2004, now Pat. No. 6,864,812.

(51) Int. Cl.
*H03M 7/00* (2006.01)
(52) U.S. Cl. .......................................... 341/50; 341/51
(58) Field of Classification Search .................. 341/50, 341/143, 118, 51; 712/228; 375/220, 262, 375/247
See application file for complete search history.

(56) References Cited

U.S. PATENT DOCUMENTS

| | | | |
|---|---|---|---|
| 3,716,851 A | 2/1973 | Neumann | |
| 5,313,648 A | 5/1994 | Ehlig et al. | |
| 5,446,456 A | 8/1995 | Seo | |
| 5,717,715 A | 2/1998 | Claydon et al. | |
| 5,835,043 A | 11/1998 | Tsuchida et al. | |
| 5,881,106 A | 3/1999 | Cartier | |
| 6,064,700 A | 5/2000 | Noguchi et al. | |

(Continued)

OTHER PUBLICATIONS

Multiplier, "The multiplier," pp. 9-1 to 9-18, no date.

(Continued)

*Primary Examiner*—Jean B Jeanglaude
(74) *Attorney, Agent, or Firm*—McAndrews, Held & Malloy, Ltd.

(57) ABSTRACT

Disclosed herein is a method and system to reduce the area and power dissipation in digital filters or multipliers Compared to radix-4 Booth coding the proposed method reduces the number of partial products by one, if the input signal has certain limits on its range. One exemplary application is echo cancellation in a full duplex pulse amplitude modulation system with 10 levels (PAM-10). Echo cancellation may be achieved by calculating a digital replica of the echo from the transmission channel. The replica signal may be calculated in a finite impulse response (FIR) filter, which multiplies the transmitted signal with estimates of the echo coefficients of the transmission channel The replica signal may be subtracted from the received signal to create an echo-free receive signal. The disclosed method may reduce the number of partial products between the PAM-10 transmit signal and each echo coefficient from three, when radix-4 Booth coding is used, to two. This in turn may reduce the number of adders in each tap multiplier of the FIR filter from two to one, resulting in lower area, lower power dissipation, and potentially higher switching speeds.

34 Claims, 3 Drawing Sheets

U.S. PATENT DOCUMENTS

| | | | |
|---|---|---|---|
| 6,275,841 B1 | 8/2001 | Potter et al. | |
| 6,292,514 B1 | 9/2001 | Yamaguchi et al. | |
| 6,463,453 B1 * | 10/2002 | Dang | 708/628 |
| 6,693,566 B2 * | 2/2004 | Jaffe et al. | 341/50 |
| 6,754,269 B1 * | 6/2004 | Yamaguchi et al. | 375/240.1 |
| 6,864,812 B1 | 3/2005 | Lutkemeyer | |
| 7,218,258 B2 | 5/2007 | Lutkemeyer | |

OTHER PUBLICATIONS

Horowitz, Computer Systems Laboratory, Stanford University, "Lecture 9: Multipliers," pp. 9-1 to 9-27, no date.

Gigabit Ethernet, http://www.electrotec.com/Gigabit_Explained.htm, "1000BASE-T Overview," Nov. 2003, pp. 1-5.

Lee Goldberg, http://www.elecdesign.com/Globals/PlanetEE/Content/2709.html, "Gigabit Ethernet PHY Chip Sets LAN Speed Record For CopperStory," Nov. 1998, pp. 1-6.

* cited by examiner

HARDWARE EFFICIENT IMPLEMENTATION OF FINITE IMPULSE RESPONSE FILTERS WITH LIMITED RANGE INPUT SIGNALS

RELATED APPLICATIONS

The present application is a continuation of U.S. patent application Ser. No. 11/058,388 entitled "HARDWARE EFFICIENT IMPLEMENTATION OF FIR FILTERS WITH LIMITED RANGE INPUT SIGNALS", filed on Feb. 15, 2005, now U.S. Pat. No. 7,218,253, which is a continuation of U.S. Non-Provisional Patent Application having Ser. No. 10/774,151 entitled "HARDWARE EFFICIENT IMPLEMENTATION OF FINITE IMPULSE RESPONSE FILTERS WITH LIMITED RANGE INPUT SIGNALS", which was filed on Feb. 5, 2004, now U.S. Pat. No. 6,864,812, the complete subject matter of each of which is hereby incorporated herein by reference, in its respective entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Information transmission at maximum transmission rates is the quest of the information transmission designer. Adapting existing data transmission infrastructure to accommodate faster transmission rates may also be desirable. As data transmission rates are increased, data corruption may result from effects such as attenuation, echo, return loss, and crosstalk in the existing transmission infrastructure.

Attenuation may be defined as signal loss between a transceiver and a receiver. Attenuation may increase with increasing data transmission frequency. Echo may occur as a result of full duplex operation or parallel transmission, i.e., where both the transmit and receive signals are active on the same wire. Residual transmit signal and cabling return loss may combine to produce unwanted signals which may be referred to as echo. Echo may occur due to power reflections due to cable impedance mismatches.

Further limitations and disadvantages of conventional and traditional approaches will become apparent to one of skill in the art, through comparison of such systems with embodiments presented in the remainder of the present application with references to the drawings.

SUMMARY OF THE INVENTION

A method and apparatus for a hardware-efficient implementation of finite impulse response filters with limited range input signals, substantially as shown in and/or described in connection with at least one of the figures, as set forth more completely in the claims.

These and other advantages and novel features of the present invention, as well as details of an illustrated embodiment thereof, will be more fully understood from the following description and drawings.

DETAILED DESCRIPTION OF THE INVENTION

Figure 1:
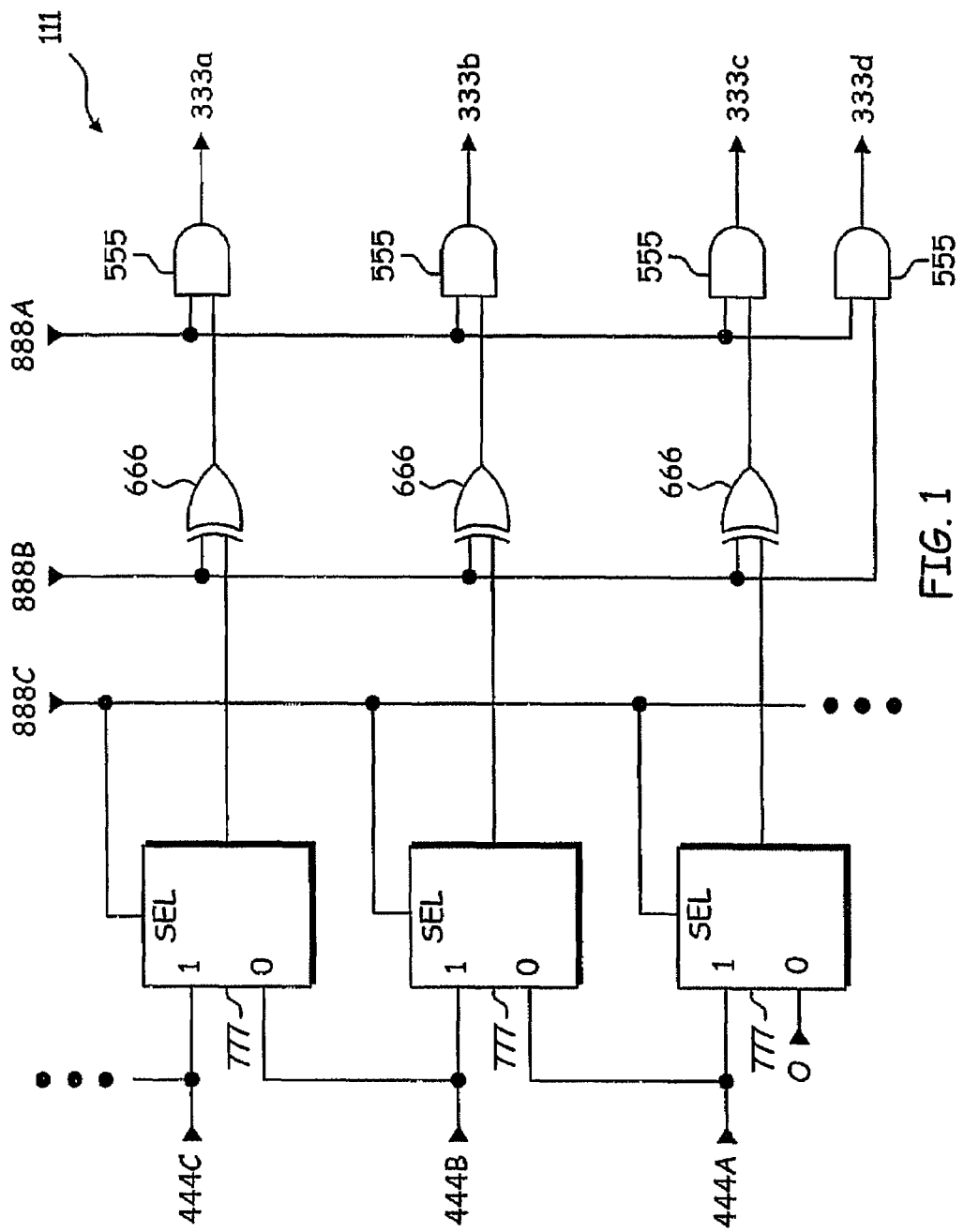
FIG. 1 is a diagram illustrating a multiplier according to an embodiment of the present invention.

Information bits may be serially transmitted using at least two level symbols, and there may be a one-to-one correspondence between the bits and the symbols. The one-to-one correspondence between the bits and symbols may result in a signal with significant frequency components at the bit rate frequency.

Communication channels may experience significant integrity degradation at higher frequencies. In some cases, communication channels may provide high quality up to a certain threshold frequency. However, at frequencies above the threshold frequency, the degradation may be very sharp, rendering communications beyond the threshold frequency impossible without providing error correction to the signals.

Many existing transmission infrastructures are provided with Category 5 (Cat-5) cabling solutions. Cat-5 cables are defined as comprising four unshielded twisted pairs of wires in a single jacket In many networks, a Cat-5 cable may connect a transceiver and a receiver to provide 4 times parallel data transmission capabilities In these systems, all four twisted pairs of wires in the Cat-5 cable may be employed simultaneously to provide four times the data transmission capability of a single cable having a pair of wires.

Communication channels having a threshold frequency may limit the data transmission rate to the threshold frequency. To overcome these shortcomings, the Pulse Amplitude Modulation level 5 (PAM-5) standard was developed for coding data words.

The PAM-5 standard may be employed to encode 8-bit data words with four five-level symbols. A number of encoders may operate in unison to achieve a high data transmission throughput rate. The symbols generated by each of the encoders may be transmitted in parallel with respect to one another.

Parallel transmission may be incompatible with some pre-existing networks designed for serial transmissions. An embodiment according to the present invention may comprise a method of data coding to adapt a transmission infrastructure to higher speed data transmission.

PAM-5 is adapted to provide greater bandwidth than binary signaling. In binary signaling, each transmitted symbol represents one bit, for example, 0 or 1. In PAM-5, each symbol represents one of five different levels, for example, (−2, −1, 0, 1, 2). Because each symbol can represent two bits of information, (four levels to represent two bits, plus an extra fifth level which may be used for error correction coding), the symbol rate, and therefore also the signal bandwidth, may be reduced by a factor of two. The fifth level of coding may provide error correction to recover transmitted symbols in the presence of signal interference such as, echo, crosstalk, etc.

Signal equalization may also be used to compensate for signal distortion introduced by the communication channel. Linear digital equalization may be provided by a finite impulse response (FR) filter. For PAM-5, a five level FIR filter may be employed.

In order to increase data transmission rates, that is, in order to send more data over the same data channels per unit time, it may be necessary to transmit more symbols in the same amount of time or transmit more bits per symbol. In an embodiment according to the present invention, PAM-10, i.e., 10 level pulse amplitude modulation, may be employed to increase the rate of data transmission, i.e., the bit rate, by transmitting more bits per symbol.

PAM-10 is adapted to provide greater bandwidth than PAM-5 and binary signaling In PAM-10, each transmitted symbol represents one of ten different levels, for example, (−9, −7, −5, −3, −1, 1, 3, 5, 7, 9). For signal processing reasons, each symbol may represent four bits of information. Because each symbol can represent four bits of information, the symbol rate, and therefore also the signal bandwidth, maybe reduced.

Signal equalization may also be used to compensate for signal distortion introduced by the communication channel. Linear digital equalization may be provided by a finite impulse response (FIR) filter. FIR filters provide echo cancellation by performing multiplications of the input signal by selected coefficients. These multiplications may produce a large number of products and additions, which may consume filter chip area and power, produce processing delays that limit symbol rate, and cause other data transmission delays Cables used for signal transmission have limited bandwidth capabilities. In order to move information at higher bit rates, more bits per symbol may be encoded. Building an echo cancellation device using a greater number of bits per symbol, ordinarily would increase the delay, chip real estate, power consumption, etc. for the echo cancellation device.

In an embodiment according to the present invention, Booth coding may be applied to multiply the input samples by interference cancellation coefficients. Booth coding may provide a reduction in the complexity of multiplication circuits by recoding the numbers being multiplied in a more compact form.

One approach to perform multiplication is to shift and add, i.e., long multiplication. For each column in the multiplier, the multiplicand is shifted the appropriate number of columns, and multiplied by the value of the digit in that column of the multiplier to obtain a product.

Following the conventional method of long multiplication, the number of products is exactly the number of columns in the multiplier. It may be possible to reduce the number of products by half using a technique of radix-4 Booth coding, or modified Booth coding Using radix-4 Booth coding, instead of shifting and adding for every column of the multiplier term and multiplying by 1 or 0, it is possible to take two columns at a time, and multiply by 2, 1, 0, −1 or −2, to obtain the same result Therefore, to multiply by 7, for example, we can multiply the product aligned against the least significant bit (LSB, first column) by −1, and multiply the product aligned with the third column by 2, for example:

Product 0=Multiplicand*−1, shifted left 0 bits;
Product 1=Multiplicand*2, shifted left 2 bits.

This gives the same result as the equivalent shift and add long multiplication method, shown below, but using fewer multiplication operations.

Product 0=Multiplicand*1, shifted left 0 bits;
Product 1=Multiplicand*1, shifted left 1 bit;
Product 2=Multiplicand*1, shifted left 2 bits;
Product 3=Multiplicand*0, shifted left 3 bits.

An advantage of this method is the halving of the number of products, resulting in a decrease in propagation delay in data transmission, reduction in the complexity of the circuit, and reduction in the power consumption of the circuit, and the ability to more compactly code information.

To Booth code the multiplier term, note that the bits of a block overlap adjacent blocks by one bit. Grouping starts with the LSB, and the first block only uses two bits of the multiplier because there is no previous block to overlap.

Aspects of the present invention may be found in a method of operating a signal processing device. The method may comprise receiving a signal sample; encoding the signal sample using a coding process to produce symbolic values; modifying the symbolic values to reduce a number of digits used to represent the symbolic values and produce coded values; and processing the coded values in the signal processing device.

In an embodiment of the present invention, the coding process may be a radix4 Booth coding process.

In an embodiment of the present invention, modifying the symbolic values may comprise changing a value of a digit in the coding process based upon a value in a next higher order digit of the symbolic value to create the coded value.

In an embodiment of the present invention, processing may comprise using the coded values input to the signal processing device. The signal processing device may comprise a digital filter.

In an embodiment of the present invention, the digital filter may comprise a finite impulse response filter.

In an embodiment of the present invention, processing the coded values in the signal processing device may further comprise inputting the coded values to the signal processing device; directing the coded values to a plurality of multipliers; multiplying the coded values by coefficients forming a plurality of products; directing the products to a plurality of adders; summing the products to produce a processed signal; delaying output of the processed signal by at least one unit delay; and outputting the processed signal.

In an embodiment of the present invention, multiplying the coded values by coefficients forming a plurality of products may further comprise directing the coded values to a plurality of multipliers and a plurality of sign inverters; multiplying the coded values by first coefficients in the multipliers to form at least one first product; and multiplying the coded values by at least one second coefficient in the sign inverters to form at least one second product.

Aspects of the present invention may also be found in a method of increasing a bit rate of transmission of a signal. The method may comprise receiving a signal sample; encoding the signal sample using a coding process to produce symbolic values having a particular number of bits; modifying the symbolic values to reduce a number of digits used to represent the symbolic values and produce coded values; and processing the coded values in the signal processing device.

In an embodiment of the present invention, reducing the number of digits used to represent the symbolic values may further comprise eliminating at least one digit during the coding process without losing any digital information; and processing more digital information per unit time with fewer processing operations.

In an embodiment of the present invention, the coding process may be a radix-4 Booth coding process.

In an embodiment of the present invention, modifying the symbolic values may comprise changing a value of a digit in the coding process based upon a value in a next higher order digit of the symbolic values to create the coded values.

In an embodiment of the present invention, processing may comprise using the coded values input to the signal processing device. The signal processing device may comprise a digital filter.

In an embodiment of the present invention, the digital filter may comprise a finite impulse response filter.

In an embodiment of the present invention, processing the coded values in the signal processing device may further comprise inputting the coded values to the signal processing device; directing the coded values to a plurality of multipliers; multiplying the coded values by coefficients forming a plurality of products; directing the products to a plurality of adders; summing the products to produce a processed signal; delaying output of the processed signal by a at least one unit delay; and outputting the processed signal.

In an embodiment of the present invention, multiplying the coded values by coefficients forming a plurality of products may further comprise directing the coded values to a plurality of multipliers and a plurality of sign inverters; multiplying the coded values by first coefficients in the multipliers to form at least one first product; and multiplying the coded values by at least one second coefficient in the sign inverters to form at least one second product.

Aspects of the present invention may also be found in a signal processing device comprising an input adapted to receiving a signal sample; an encoder adapted to encoding the signal sample using a coding process to produce symbolic values; and a processor adapted to modify the symbolic values to reduce a number of digits used to represent the symbolic values, produce coded values, and process the coded values in the signal processing device.

In an embodiment of the present invention, the device may further comprise a plurality of multipliers; and a plurality of adders, wherein coded values may be input to the signal processing device, multiplied by a plurality of coefficient bits in the plurality of multipliers to create a plurality products, wherein the products may be summed together, and the processed signal may undergo a unit delay before being output from the signal processing device.

In an embodiment of the present invention, one coding process that the encoder may be adapted to perform is a radix-4 Booth coding process.

In an embodiment of the present invention, in modifying the symbolic values, the processor may be adapted to change a value of a digit in the coding process based upon a value in a next higher order digit of the symbolic values to create the coded value.

In an embodiment of the present invention, the signal processing device may comprise a digital filter.

In an embodiment of the present invention, the digital filter may comprise a finite impulse response filter.

In an embodiment of the present invention, the signal processing device may also be adapted to input the coded values; multiply the coded values by coefficient bits forming a plurality of products; sum the products to produce a processed signal; delay output of the processed signal by a at least one unit delay; and output the processed signal.

In an embodiment of the present invention, the signal processing device may also be adapted to multiply the coded values by first coefficients in the multipliers to form at least one first product; and multiply the coded values by at least one second coefficient in sign inverters to form at least one second product.

FIG. 1 is a diagram illustrating a multiplier 111 according to an embodiment of the present invention In FIG. 1, a set of control signals may be applied to the multiplier 111. The values of each of the control signals causes the multiplier 111 to operate upon an incoming coded value, as discussed below, in a particular manner, (i.e., zero, negate, multiply/shift by one or two columns). Three digital control signal inputs (888a, 888b, and 888c) may be provided, wherein at each control signal input, either a 1 or 0 may be input.

The three digital control signals together cooperatively determine the particular multiplication operation that is performed upon the coded input. The particular operation that the multiplier 111 performs upon the coded input signal may vary, based upon the relationship of the three control signal inputs (888a, 888b, and 888c) operating together as discussed below.

Coded input values may be multiplied by a plurality of coefficient bits (444a, 444b, and 444c), which may be input to a plurality of selectors 777, and a plurality of exclusive or (XOR) gates 666, and a plurality of AND gates 555, to modify the coded values, and thus modify the corresponding transmitted signal.

In an embodiment according to the present invention, the output of the Booth coder with the input being bits from the multiplier may be as follows:

Bits from multiplier→[Booth Coder]→Negate
Bits from multiplier→[Booth Coder]→Zero
Bits from multiplier→[Booth Coder]→shift (x1 or x2)

The zero signal may indicate whether the multiplicand is zeroed before being used as a product, which may be the same as multiplying by 0. The shift signal (x1 or x2) may be used as a control signal to a 2:1 multiplexer to select whether or not the product bits are shifted left zero or one position, which may be the same as multiplying by 1 or 2. The negate signal may indicate whether or not to invert (sign inversion) all of the bits to create a negative product, which may be the same as multiplying by −1.

TABLE 1

Multiplier Operations and Control Signal Inputs

| Row | Input 1 (888c) (Multiply by 1 or 2) | Input 2 (888b) (Negate) | Input 3 (888a) (Zero) | Output (Results) |
|---|---|---|---|---|
| 1 | X | X | 0 | 0 * Multiplicand |
| 2 | 0 | 0 | 1 | 1 * Multiplicand |
| 3 | 1 | 0 | 1 | 2 * Multiplicand |
| 4 | 0 | 1 | 1 | −1 * Multiplicand |
| 5 | 1 | 1 | 1 | −2 * Multiplicand |

Table 1 illustrates possible multiplication operations which may be performed by a multiplier according to an embodiment of the present invention.

According to an embodiment of the present invention, and illustrated in Table 1 above, row 1 reveals a situation wherein regardless of what the input control signal values are at input 1 988c and input 2 889b, (represented by X), when the input control signal value at input 3 888a is 0, then the outputs, (333a, 333b, 333c, and 333d, etc., for example), are 0, (i.e., being the same as multiplying the coded value by zero, 0*Multiplicand). Alternatively, when the input value at input 3 888a is 1, then the coded value is passed through unchanged, (being the same as multiplying by 1).

In row 2, when input 1 888c and input 2 888b are both 0, (i.e., meaning the coded value is passed through unchanged), then the outputs (333a-333d) are 1*Multiplicand. Of course, input 3 888a must be 1, otherwise the outputs (333a-333d) are 0.

In row 3, when input 1 888c is 1 and input 2 888b is 0, then the outputs (333a-333d) are 2*Multiplicand. This demonstrates that the corresponding operation of input 1 888c is to pass the coded value through unchanged when input 1 888c is 0, (i.e., passing through unchanged being the same as multiplying by 1), and shifting the coded value 1 column or position when input 2 888b is 1, (i.e., being the same as multiplying the coded value by 2). Of course, input 3 888a must be 1, otherwise the outputs (333a-333d) are 0.

In row 4, when input 1 888c is 0 and input 2 888b is 1, then the outputs (333a-333d) are −1*Multiplicand. This demonstrates that the corresponding operations on a coded value by when input 2 888b is 1 is a sign inverting process, (i.e., being the same as multiplying by a −1), and when input 2 888b is 0, the coded value is passed through unchanged, (i.e., being the same as multiplying by 1). Of course, input 3 888a must be 1, otherwise the outputs (333a-333d) are 0.

In row 5, when input 1 888c is 1 and input 2 888b is 1, then the outputs (333a-333d) are −2*Multiplicand. Of course, input 3 888a must be 1, otherwise the outputs (333a-333d) are 0.

In an embodiment according to the present invention, the method may comprise further reducing the number of digits required to code a particular number or value. In an embodiment according to the present invention, the method may comprise reducing the coded value by at least one digit, (i.e., eliminating at least one digit in the coding process), resulting in fewer digits being necessary to be transmitted, while transmitting the same amount of data per unit time.

For example, 5 bits may be required to transmit the numerical value of negative nine. However, by recognizing that $-9=-16+8-1$ or alternatively, $-9=(-2*4)-1$, the coding for the value may be significantly reduced, at least reduced by one digit, for example.

For an n-bit word, up to n operations are required to perform the multiplications using standard Booth coding. However, according to an embodiment of the present invention, using a modified Radix-4 Booth coding scheme, for an n-bit word, fewer operations are required to perform the multiplications.

The operations performed may be additions, subtractions, or no operations at all, for every two bits of the original data word. According to an embodiment of the present invention, because half of the multiplication operations have been eliminated, therefore the logic is required to code the values over the standard binary multiplication method.

In an embodiment according to the present invention, a method of optimized coding of a pulse amplitude modulated level 10 (PAM-10) signal may be performed as follows. In PAM-10, there are 10 levels represented by the values in the following table

TABLE 2

Comparison of Various Coding Values

| | | Booth Coded | | | Optimum Coded | |
|---|---|---|---|---|---|---|
| Decimal | Binary | 16 $X_b^4$ | 4 $X_b^2$ | 1 $X_b^0$ | 4 $X_o^2$ | 1 $X_o^0$ |
| −9 | 10111 | −1 | +2 | −1 | −2 | −1 |
| −7 | 11001 | 0 | −2 | +1 | −2 | +1 |
| −5 | 11011 | 0 | −1 | −1 | −1 | −1 |
| −3 | 11101 | 0 | −1 | +1 | −1 | +1 |
| −1 | 11111 | 0 | 0 | −1 | 0 | −1 |
| 1 | 00001 | 0 | 0 | +1 | 0 | +1 |
| 3 | 00011 | 0 | +1 | −1 | +1 | −1 |
| 5 | 00101 | 0 | +1 | +1 | +1 | +1 |
| 7 | 00111 | 0 | +2 | −1 | +2 | −1 |
| 9 | 01001 | +1 | −2 | +1 | +2 | +1 |

Table 2 illustrates a comparison of a plurality of coded values according to an embodiment of the present invention.

Applying the optimum coding scheme according to the present invention, (modified radix-4 Booth coding), only two digits may be used to code and represent symbolic values that would ordinarily require three digits to code or represent applying previous coding techniques. Therefore, according to an embodiment of the present invention, 10 levels may be encoded employing 4 bits (i.e., 2 radix-4 digits).

The radix-4 Booth code may be defined as follows:

$$C*X = C*X_b^0 + 4*C*X_b^2 + 16*C*X_b^4$$

wherein two adders are required to calculate the product C*X, and 6 bits are needed to represent $X_b$.

The optimum code according to the present invention may be defined as follows:

$$C*X = C*X_o^0 + 4*C*X_o^2$$

wherein only one adder may be used to calculate C*X, and no hardware may be required to calculate $16*C*X_b^4$, and only four bits may be required to represent $X_o$. It is noted that only two values of the radix 4 Booth coding used to express the $X_b^4$ digit of the PAM-10 signal are non-zero (i.e., 9 and −9, as shown above).

In an embodiment of the present invention, by changing the sign of the radix 4 Booth coded digit corresponding to $X_b^2$ (i.e., from + to −, and from + to −) for the encoding of −9 and +9, the digit corresponding to $X_b^4$ may be eliminated. This result is possible because only a portion of the range of values, (i.e., −9 and +9), of $X_b^4$ digit of a 3 digit Booth coded value are needed.

Therefore, according to an embodiment of the present invention, because the multiplication operation has been simplified by the reduction of a term, (i.e., the $X_b^4$ term having been eliminated), the processing hardware may be simplified, the power consumption is reduced, and the circuit chip area used for the processing is reduced. Although the present invention has been described herein with respect to embodiments utilizing digital filters, and in particular, finite impulse response filters, an embodiment according to the present invention may have application in other systems involving the processing of digital information in which only a portion of the range of coded digital values is used.

In an embodiment of the present invention, the method comprising application of optimum coding as set forth above may provide at least one less adder for every multiplier and eliminate at least one partial product multiplier for the operation [−1, 0, 1]*C resulting in faster data transmission than previous data transmission applications.

Further according to an embodiment of the present invention, the optimum coding scheme may be distributed with two bits less than previous data transmission application resulting in at least area reduction, i.e., integrated circuit area reductions, and power savings over previous data transmission applications.

According to an embodiment of the present invention, the optimum coding scheme may also be applicable to systems employing an even greater number of pulse amplitude modulation levels, for example, PAM-21, and PAM-40, when a restricted range of levels is used. The number of Booth coded digits may be reduced through coding according to an embodiment of the present invention. For example, by coding the following values [−10, −9, −8, . . . 8, 9, 10] a 21 level coding scheme (PAM-21) may be realized.

In an embodiment of the present invention, application of the optimum coding method may be performed when $X_b^n$ and the most significant digit in a modified Booth coded number uses values between [+1, 0, −1] and if the following condition hold true:

when $X_b{}^n=-1$, then $X_b{}^{n-2}=2$; and   1)

when $X_b{}^n=1$, then $X_b{}^{n-2}=-2$.   2)

Figure 2:
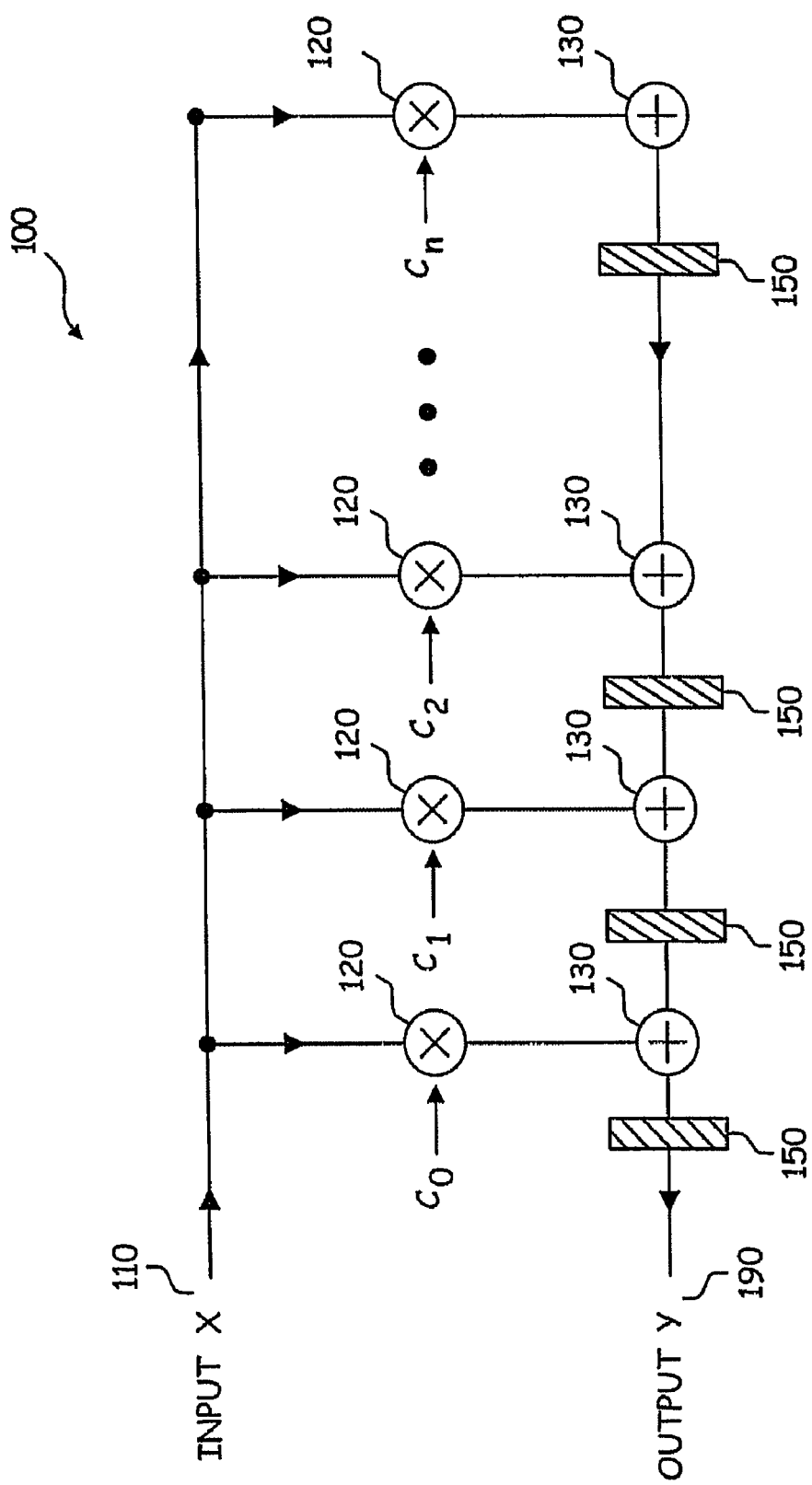
FIG. 2 illustrates a finite impulse response filter with a 10-level input signal according to an embodiment of the present invention.

FIG. 2 illustrates a finite impulse response (FR) filter 100 with a 10-level input signal according to an embodiment of the present invention. In FIG. 2, the input 110 to FIR filter 100 may be a 10-level input signal as explained above and may be designated by the value X. Encoding the signal sample may be performed by an encoder (not shown) using a coding process to produce symbolic values.

A 10-level input signal may comprise, for example, values as follows:

X=−9, −7, −5, −3, −1, 1, 3, 5, 7, 9.

The signal value X enters the FIR filter 100 at input 110. The input signal, having one of the 10 values above is passed through a plurality of multipliers 120 where the signal is multiplied by coefficients, for example $C_0, C_1, C_2, \ldots, C_n$ creating a plurality of products. The products may then be directed to a plurality of adders 130. The outputs of each of the adders 130 may be delayed for a time represented by unit delay 150 before being passed to the next adder 130 and eventually to output 190.

Accordingly, after processing, Y may be described as a function of X, where k may be defined as a unit of time, as shown below:

$Y(k)=C_0*X(k-1)+C_1*X(k-2)+C_2*X(k-3)+ \ldots C_n*X(k-n+1)$.

According to an embodiment of the present invention, signal processing for a 10 level input signal $X=[X_0, X_1, X_2, \ldots]$ may be defined as follows:

| Time | Output Signal |
| --- | --- |
| k = 0 | 0 |
| k = 1 | $X_0 * C_0$ |
| k = 2 | $X_1 * C_0 + X_0 * C_1$ |
| k = 3 | $X_2 * C_0 + X_1 * C_1 + X_0 * C_2$ |
| k = 4 | $X_3 * C_0 + X_2 * C_1 + X_1 * C_2 + X_0 * C_3$ |
| ... | ... |
| k = n | $X_{n-1} * C_0 + X_{n-2} * C_1 + X_{n-3} * C_2 + X_{n-4} * C_3 + \ldots + X_{n-m} * C_{m-1}$ | where k is a quantity of time, X is a 10 level coded input signal, and $C_j, j = 0 \ldots m$ are the coefficients.

The multipliers may perform at least one of the operations discussed above based upon the values of the control signals controlling the multipliers. After the multiplication operations are performed the coded values may be directed to the plurality of adders 130. The products may be summed and the output maybe delayed by at least one unit delay 150. The signal may then be output 190 from the filter. The input signal 110, after multiplications, additions, etc., makes up the output signal 190 from the filter 100.

Figure 3:
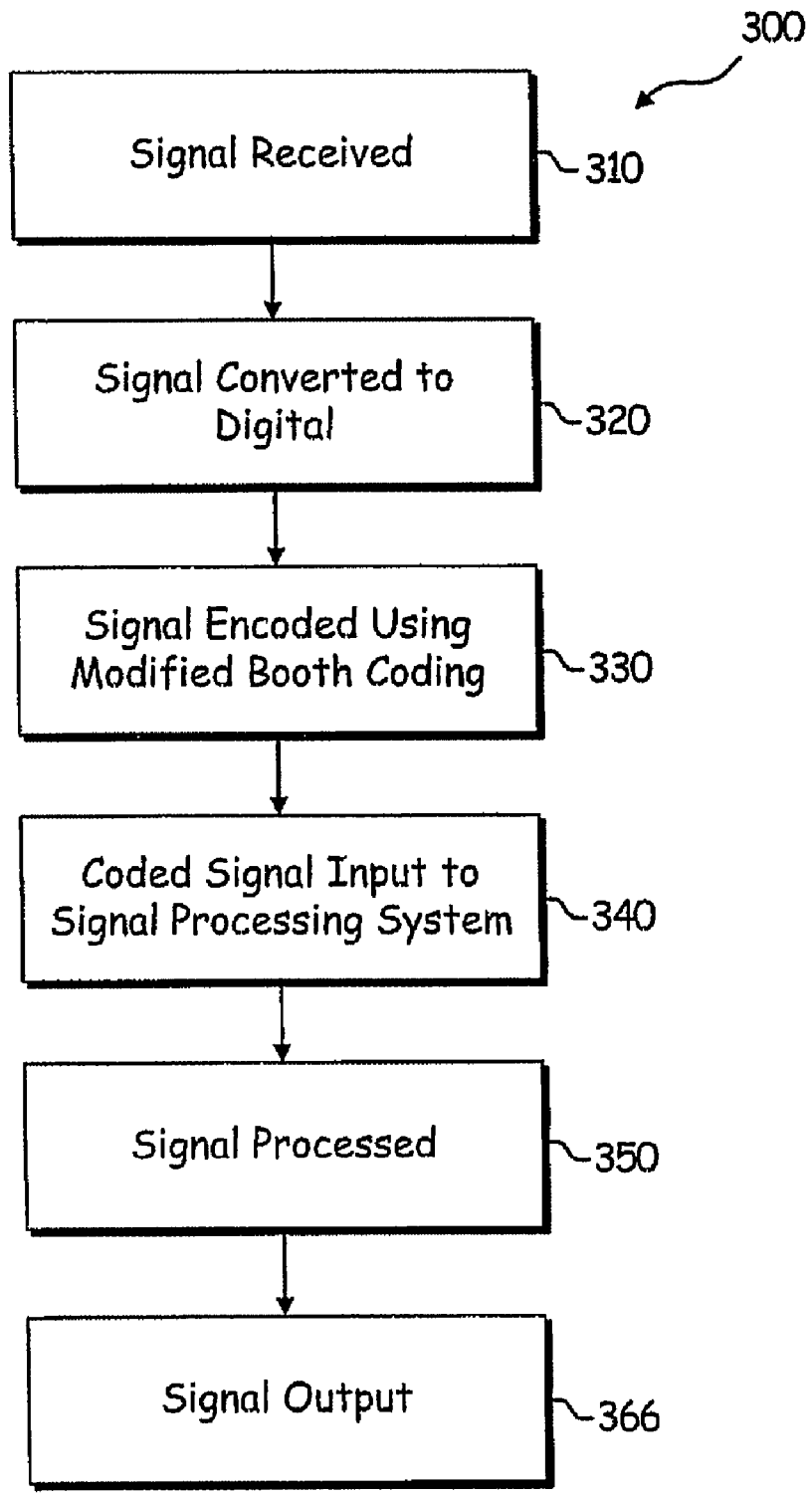
FIG. 3 is a flow chart illustrating processing of signals using a finite impulse response filter with a 10-level input signal according to an embodiment of the present invention.

FIG. 3 is a flow chart 300 illustrating processing of signals using a finite impulse response filter with a 10-level input signal according to an embodiment of the present invention In FIG. 3, initially an analog signal may be received (block 310). The analog signal may be converted to a digital signal using an A/D converter (block 320). The signal may then be encoded using a modified Booth coding procedure (block 330), as discussed above. The coded signal may be input to a signal processing system (block 340) which may comprise a FIR filter for signal processing (block 350).

During signal processing in the FIR filter of the signal processing system, the coded signal values may be passed to multipliers where they may be multiplied by coefficients. Products resulting from the multiplications may be directed to adders. The products may be summed. The processed signal may be delayed by at least one unit delay. The signal may then be output (block 366) from the signal processing system.

Processing signals according to the embodiment illustrated in FIG. 3, enables the complexity of signal processing systems to be reduced by simplifying the complexity of multiplication circuits. An advantageous result according to an embodiment of the present invention is decreasing processor chip size and therefore processor cost by processing more information with coded values comprising more information or bits per symbol.

The signal processing method according to the present invention may avoid interference and signal distortion because the information is transmitted without increasing the frequency of operation to intolerable levels. Signal processing activity is also reduced by recoding the signal values being processed in a more compact form thus permitting an increased throughput, or more bits per symbol being transmitted per unit time. Power consumption may also be reduced because less processing is required to transmit more information with fewer coded values according to an embodiment of the present invention.

In an embodiment according to the present invention, modified Radix-4 Booth coding permits using only 4 digits for the encoding of a PAM-10 signal, resulting in at least a halving of the number of products to be processed. In an embodiment according to the present invention, the filter chip size may be reduced while at the same time providing a higher bit rate of transmission. The delay in transmission may also be reduced resulting in faster transmission. Additionally the amount of power consumed per operation may also be decreased.

In an embodiment according to the present invention, a 2.5 Gigabit/second data transmission rate may be accomplished by applying the PAM-10 coding method and a standard Cat-5 cables. Remembering that a Cat-5 cable comprises 4 unshielded twisted wire pairs, and by transmitting 3 bits per symbol at a frequency of 208 MHz, the 2.5 Gigabit/second transmission rate may be described as follows:

(4 wire pairs)*(208 MHz transmission frequency)*(3 bits per symbol) is approximately 2.5 Gigabits of information transmitted per second.

In an embodiment of the present invention, more information, i.e., a greater number of bits may be transmitted in the same amount of time using PAM-10 coding techniques. Although PAM-10 coding has been described in the present application, PAM-21, PAM-40, etc., may also be applied where appropriate to further increase the bit rate of data transmission by increasing the number of bits per symbol being coded The invention may also be used in multipliers.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A system for processing a signal, the system comprising:
one or more circuits operable to, at least:
encode the signal employing a coding process, the coding process producing symbolic values; and
modify the symbolic values by reducing a number of digits employed to express the symbolic values.

2. The system according to claim 1, wherein the coding process comprises a Radix-4 Booth coding process.

3. The system according to claim 1, wherein modifying the symbolic values comprises changing at least one value of a digit in the coding process based upon a value in a next higher order digit of the symbolic value to create a coded value.

4. The system according to claim 1, wherein the one or more circuits comprises a digital filter, and wherein the symbolic values are input to the digital filter.

5. The system according to claim 4, wherein the digital filter comprises a finite impulse response filter.

6. The system according to claim 1, wherein the one or more circuits are further operable to, at least:
multiply the symbolic values by coefficients to form a plurality of products;
sum the plurality of products; and
delay the summed plurality of products.

7. The system according to claim 6, wherein the one or more circuits are further operable to, at least:
process the symbolic values via at least one multiplier and at least one sign inverter;
multiply the symbolic values by first coefficients in the at least one multiplier to form at least one first product; and
multiply the symbolic values by at least one second coefficient in the at least one sign inverter to form at least one second product.

8. A circuit for increasing a bit rate of transmission of a signal, the circuit comprising:
at least one processor operable to, at least:
encode the signal to produce symbolic values having a particular number of digits; and
modify the symbolic values by reducing the number of digits used to express the symbolic values.

9. The circuit according to claim 8, wherein reducing the number of digits used to express the symbolic values comprises:
eliminating at least one digit during the encoding without loss of information.

10. The circuit according to claim 8, wherein the coding process is a Radix-4 Booth coding process.

11. The circuit according to claim 8, wherein modifying the symbolic values comprises changing at least one value of a digit of a symbolic value during encoding based upon a value in a next higher order digit of the symbolic value.

12. The circuit according to claim 8, wherein the at least one processor comprises a digital filter, and wherein symbolic values are input to the digital filter.

13. The circuit according to claim 12, wherein the digital filter comprises a finite impulse response filter.

14. The circuit according to claim 8, wherein the at least one processor is further operable to, at least:
multiply symbolic values by coefficients to form a plurality of products;
sum the plurality of products; and
output the sum.

15. The circuit according to claim 14, wherein the at least one processor is further operable to, at least:
direct symbolic values to at least one multiplier and at least one sign inverter;
multiply the symbolic values by first coefficients in the at least one multiplier to form at least one first product; and
multiply the symbolic values by at least one second coefficient in the at least one sign inverter to form at least one second product.

16. A digital filter comprising:
one or more circuits operable to, at least:
receive symbolic values representing a signal, the symbolic values produced by encoding the signal to a particular number of digits;
modify the symbolic values to reduce the number of digits used to express the symbolic values;
multiply the symbolic values by coefficients to form a plurality of products;
sum the plurality of products; and
output the sum.

17. The digital filter according to claim 16, wherein modifying the symbolic values changes a digit of the symbolic values based upon a value in a next higher order digit of the symbolic values.

18. The digital filter according to claim 16, wherein the encoding employs a Radix-4 Booth coding process on the signal.

19. The digital filter according to claim 16, wherein the digital filter functions as a finite impulse response filter.

20. The digital filter according to claim 16, wherein the digital filter further comprises encoding circuitry to produce the symbolic values from the signal.

21. A circuit for increasing a bit rate of transmission of a signal, the circuit comprising:
at least one processor operable to, at least:
encode the signal employing a coding process, the coding process producing symbolic values; and
modify the symbolic values by reducing a number of digits employed to express the symbolic values.

22. The circuit according to claim 21, wherein the coding process comprises a Radix-4 Booth coding process.

23. The circuit according to claim 21, wherein modifying the symbolic values comprises changing at least one value of a digit in the coding process based upon a value in a next higher order digit of the symbolic value to create a coded value.

24. The circuit according to claim 21, wherein the at least one processor comprises a digital filter, and wherein the symbolic values are input to the digital filter.

25. The circuit according to claim 24, wherein the digital filter comprises a finite impulse response filter.

26. The circuit according to claim 21, wherein the at least one processor is further operable to, at least:
multiply the symbolic values by coefficients to form a plurality of products;
sum the plurality of products; and
delay the summed plurality of products.

27. The circuit according to claim 26, wherein the at least one processor is further operable to, at least:
process the symbolic values via at least one multiplier and at least one sign inverter;
multiply the symbolic values by first coefficients in the at least one multiplier to form at least one first product; and multiply the symbolic values by at least one second coefficient in the at least one sign inverter to form at least one second product.

28. A system for processing a signal, the system comprising:
one or more circuits operable to, at least:
encode the signal to produce symbolic values having a particular number of digits; and
modify the symbolic values by reducing the number of digits used to express the symbolic values.

29. The system according to claim 28, wherein reducing the number of digits used to express the symbolic values comprises:
eliminating at least one digit during the encoding without loss of information.

30. The system according to claim 28, wherein the coding process is a Radix-4 Booth coding process.

31. The system according to claim 28, wherein modifying the symbolic values comprises changing at least one value of a digit of a symbolic value during encoding based upon a value in a next higher order digit of the symbolic value.

32. The system according to claim 28, wherein the one or more circuits comprise a digital filter, and wherein the symbolic values are input to the digital filter.

33. The system according to claim 32, wherein the digital filter comprises a finite impulse response filter.

34. The system according to claim 28, wherein the one or more circuits is further operable to, at least:
multiply symbolic values by coefficients to form a plurality of products;
sum the plurality of products; and
output the sum.

* * * * *